(12) United States Patent
Takamura et al.

(10) Patent No.: US 10,381,203 B2
(45) Date of Patent: Aug. 13, 2019

(54) BACKING PLATE OBTAINED BY DIFFUSION-BONDING ANTICORROSIVE METAL AND MO OR MO ALLOY, AND SPUTTERING TARGET-BACKING PLATE ASSEMBLY PROVIDED WITH SAID BACKING PLATE

(71) Applicant: JX Nippon Mining & Metals Corporation, Tokyo (JP)

(72) Inventors: Hiroshi Takamura, Ibaraki (JP); Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 126 days.

(21) Appl. No.: 15/329,339

(22) PCT Filed: Jul. 16, 2015

(86) PCT No.: PCT/JP2015/070344
§ 371 (c)(1),
(2) Date: Jan. 26, 2017

(87) PCT Pub. No.: WO2016/017432
PCT Pub. Date: Feb. 4, 2016

(65) Prior Publication Data
US 2017/0213712 A1    Jul. 27, 2017

(30) Foreign Application Priority Data

Jul. 31, 2014   (JP) ................................. 2014-155674

(51) Int. Cl.
*H01J 37/34*     (2006.01)
*C22C 27/04*     (2006.01)
*C23C 14/34*     (2006.01)

(52) U.S. Cl.
CPC .......... *H01J 37/3435* (2013.01); *C22C 27/04* (2013.01); *C23C 14/3407* (2013.01); *H01J 37/3417* (2013.01)

(58) Field of Classification Search
CPC .. C22C 27/04; C23C 14/3407; H01J 37/3417; H01J 37/3435
(Continued)

(56) References Cited

U.S. PATENT DOCUMENTS 5,693,203 A   12/1997   Ohhashi et al.
6,793,124 B1   9/2004   Takahashi et al.
(Continued)

FOREIGN PATENT DOCUMENTS

JP   S62-067168 A   3/1987
JP   H04-099270 A   3/1992
(Continued)

*Primary Examiner* — Rodney G McDonald
(74) *Attorney, Agent, or Firm* — Howson & Howson LLP

(57) ABSTRACT

Provided is a backing plate obtaining by bonding an anticorrosive metal and Mo or a Mo alloy, wherein the backing plate comprises, on a surface of the Mo or Mo alloy backing plate to be cooled (cooling surface side), a layer having a thickness corresponding to 1/40 to 1/8 of a total thickness of the backing plate and formed from an anticorrosive metal obtained by bonding one or more types of metals selected from among Cu, Al and Ti, or an alloy thereof. Additionally provided is a sputtering target-backing plate assembly obtained by bonding the foregoing Mo or Mo alloy backing plate and a target formed from a low thermal expansion material.

Particularly in semiconductor applications, reductions in size have progressed and control of particles during sputtering has become stricter. The present invention aims to resolve the problem of warpage of sputtering targets formed
(Continued)

1. Mo or Mo alloy
2. Anticorrosive metal
3. Sputtering target material
4. Brazing material from low thermal expansion materials and problems occurring with respect to the anticorrosive properties of Mo or Mo alloy backing plates.

14 Claims, 2 Drawing Sheets

(58) Field of Classification Search
USPC ..................................................... 204/298.12
See application file for complete search history.

(56) References Cited

U.S. PATENT DOCUMENTS

| | | | |
|---|---|---|---|
| 7,347,353 | B2 | 3/2008 | Yamakoshi et al. |
| 8,157,973 | B2 | 4/2012 | Oda et al. |
| 9,062,371 | B2 | 6/2015 | Koido |
| 2007/0084719 | A1* | 4/2007 | Wickersham, Jr. ........................ C23C 14/3407 204/298.12 |
| 2007/0107185 | A1 | 5/2007 | Bailey et al. |
| 2008/0116066 | A1 | 5/2008 | Miyashita |
| 2009/0008245 | A1 | 1/2009 | Yamakoshi et al. |
| 2009/0229975 | A1 | 9/2009 | Yamakoshi |
| 2012/0318669 | A1 | 12/2012 | Ikeda et al. |
| 2013/0220805 | A1 | 8/2013 | Tsukamoto et al. |
| 2014/0311900 | A1 | 10/2014 | Yuan et al. |
| 2014/0318953 | A1 | 10/2014 | Nagata et al. |
| 2015/0197848 | A1 | 7/2015 | Suzuki et al. |
| 2016/0086777 | A1 | 3/2016 | Nagatsu et al. |

FOREIGN PATENT DOCUMENTS

| | | |
|---|---|---|
| JP | H06-314600 A | 11/1994 |
| JP | H10-046329 A | 2/1998 |
| JP | 2001-164361 A | 6/2001 |
| JP | 2013-227619 A | 11/2013 |
| WO | 2012/066764 A1 | 5/2012 |
| WO | WO 2013/122927 * | 8/2013 |
| WO | WO 2014/107558 * | 7/2014 |

* cited by examiner

[Fig. 1]
a)
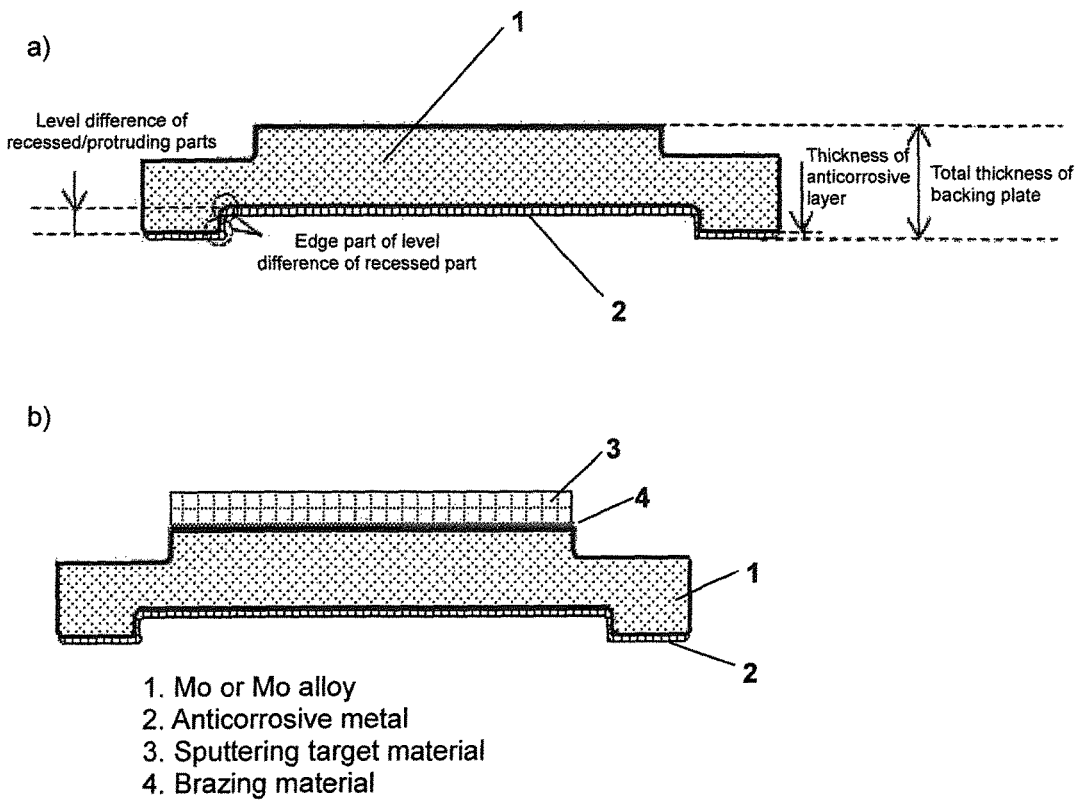
b)
1. Mo or Mo alloy
2. Anticorrosive metal
3. Sputtering target material
4. Brazing material
[Fig. 2]
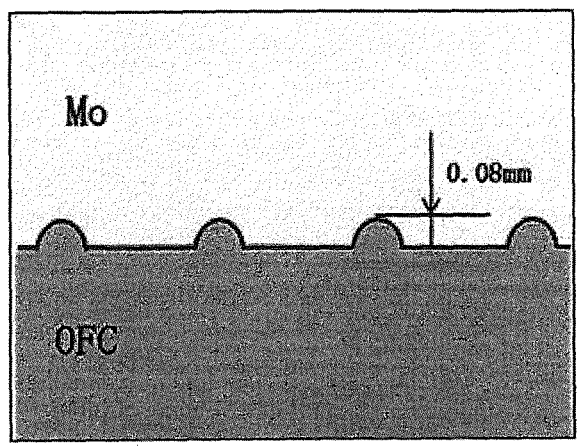

[Fig. 3]
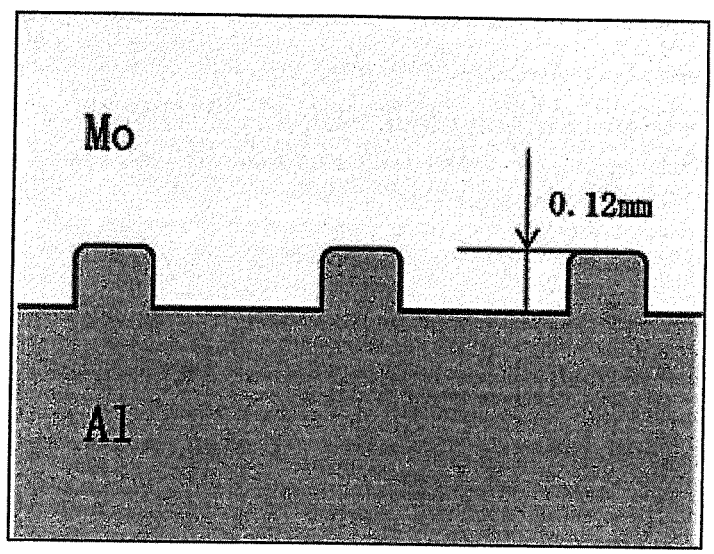

BACKING PLATE OBTAINED BY DIFFUSION-BONDING ANTICORROSIVE METAL AND MO OR MO ALLOY, AND SPUTTERING TARGET-BACKING PLATE ASSEMBLY PROVIDED WITH SAID BACKING PLATE

BACKGROUND

The present invention relates to a backing plate to be used when using a low thermal expansion material as a sputtering target material, and particularly a backing plate obtained by diffusion-bonding an anticorrosive metal and Mo or a Mo alloy and capable of preventing warpage (deformation) during the bonding of a sputtering target and a backing plate or during sputtering, as well as a sputtering target-backing plate assembly provided with such a backing plate.

In recent years, various thin films are now required in the application of semiconductor devices, and demands of low thermal expansion materials such as silicon, germanium, and carbon are also increasing. Moreover, as the diameter of silicon wafers to be used as the substrate increases to 200 mm, 300 mm, and 450 mm, sputtering targets also grow in size, and there are needs to produce large-diameter targets also based on the foregoing low thermal expansion materials.

Meanwhile, the miniaturization of semiconductor devices has advanced to the nano region, and there are demands for depositing thin films that are thinner than conventional thin films and at a uniform film thickness across the entire substrate. Thus, the control of warpage of sputtering targets is also becoming stricter.

When producing a target formed from a low thermal expansion material, as the diameter becomes larger, there is a problem in that the difference in the thermal expansion between the target material and the backing plate material increases, and the target is prone to warpage.

Furthermore, in recent years, sputtering is being performed at high power to improve the production efficiency. Issues that become problematic during this kind of high power sputtering are the strength and cooling capacity (favorable thermal conductivity) of the backing plate itself and the bonding strength of the backing plate and the target.

In particular, when brazing a low thermal expansion target material and a generally used copper backing plate by heating the target material and the backing plate to a temperature that is equal to or higher than the melting point of a brazing material and then cooling the target material and the backing plate, the target material will become warped (deformed) in the shape of a protrusion since the copper backing plate having a greater coefficient of expansion will shrink more, and this warpage (deformation) becomes a factor that obstructs the formation of a uniform film during sputtering. Moreover, the difference in shrinkage of both materials also becomes a problem in deteriorating the bonding strength at the bonded interface.

In the application of recent semiconductors in which high quality thin film are being demanded more stringently, there were needs to resolve the foregoing problems. Furthermore, in addition to having favorable sputtering characteristics, demanded are sputtering targets having a backing plate with superior anticorrosive properties that will not contaminate the clean room or cooling water.

As conventional technologies, there are some examples where Mo (molybdenum), which has a relatively low thermal expansion among metal materials, is used as the bonding layer or the backing plate. As one such example, there is Patent Document 1. Paragraph [0006] of Patent Document 1 describes that, since warpage arises from the difference in the coefficient of thermal expansion between the target member and the backing plate during the cooling process after being bonded, and the target member becomes cracked due to such warpage, the object of Patent Document 1 is to provide a sputtering target with minimal warpage and superior cooling efficiency (paragraph [0008]). Nevertheless, this solution is a method of mixing a metal powder, such as molybdenum powder, in the metal bonding material layer, and is a method that is completely different from the present invention described later.

Paragraph [0006] of Patent Document 2 describes that a support plate material (backing plate) should be selected in consideration of its strength, anticorrosive properties, and heat-transfer properties, and offers molybdenum having low conductivity as one option of the support plate material as a material for reducing the eddy current in order to generate more stable plasma (refer to paragraph [0007], paragraph [0027]).

Nevertheless, when a molybdenum backing plate is used and cooling water is caused to flow so that it directly comes into contact with the molybdenum backing plate, rust of molybdenum oxide will easily arise, and contaminate the surrounding environment of the sputtering equipment. However, Patent Document 2 offers no description whatsoever regarding the means for improving the anticorrosive properties.

Moreover, Patent Document 3 describes a Si target which uses Mo or a Mo/Cu complex as the backing plate. Furthermore, Patent Document 3 describes that the backing plate material should be selected among materials having a thermal expansion coefficient (CTE) that is approximate to that of silicon. Nevertheless, while various methods may be considered for producing the Mo/Cu composite material, Patent Document 3 offers no description regarding the specific method of solution.

Moreover, Patent Document 3 offers no description regarding anticorrosive properties or the thickness of Mo/Cu, and it is considered that the intended requirement specification of the sputtering target cannot be achieved merely by compounding Mo and Cu.

CITATION LIST

Patent Documents

Patent Document 1: JP 3829367 B
Patent Document 2: JP 2007-534834 A
Patent Document 3: WO 2013/070679 A1

SUMMARY

The present invention is a Mo or Mo alloy backing plate to be bonded to a target formed from a low thermal expansion material, wherein the Mo or Mo alloy backing plate comprises, on a surface of the Mo or Mo alloy backing plate, from which side the backing plate is cooled (cooling surface side), a layer, which has a thickness corresponding to $1/40$ to $1/8$ of a total thickness of the backing plate and is formed from an anticorrosive metal obtained by diffusion-bonding one or more types of metals selected from among Cu, Al and Ti, or an alloy thereof. Issues that become problematic during sputtering are the strength and cooling capacity of the backing plate itself and the bonding strength of the backing plate and the target.

Moreover, another issue is to prevent the contamination of the cooling water of sputtering equipment and the surrounding environment such as the clean room.

When using molybdenum as the backing plate and performing water-cooling in order to reduce the thermal expansion difference, treatment for preventing the generation of rust is required. An object of the present invention is to resolve the foregoing problems.

In order to achieve the foregoing object, the present invention provides:

1) A Mo or Mo alloy backing plate to be bonded to a target, wherein the Mo or Mo alloy backing plate comprises, on a surface of the Mo or Mo alloy backing plate to be cooled (cooling surface side), a layer having a thickness corresponding to 1/40 to 1/8 of a total thickness of the backing plate and formed from an anticorrosive metal.
2) The Mo or Mo alloy backing plate according to 1) above, wherein the anticorrosive metal is one or more types of metals selected from among Cu, Al and Ti, or an alloy thereof.
3) The Mo or Mo alloy backing plate according to 1) or 2) above, wherein the surface of the Mo or Mo alloy backing plate to be bonded with the anticorrosive metal has a level difference, and the level difference is 2 mm or more.
4) The Mo or Mo alloy backing plate according to any one of 1) to 3) above, wherein a level difference part of the surface of the Mo or Mo alloy backing plate to be bonded with the anticorrosive metal has a curve of R1 to R3.
5) The Mo or Mo alloy backing plate according to any one of 1) to 4) above, wherein the Mo or Mo alloy backing plate is of a disk shape, and a diameter thereof is 500 mm or more.
6) The Mo or Mo alloy backing plate according to any one of 1) to 5) above, wherein a bonded surface of the Mo or Mo alloy backing plate and the anticorrosive metal at the diffusion bonded interface has grooves having a depth of 0.08 to 0.4 mm.
7) The Mo alloy backing plate according to any one of 1) to 6) above, wherein the Mo alloy is an alloy containing Mo in an amount of 80 wt % or more.
8) A sputtering target-backing plate assembly, wherein the Mo or Mo alloy backing plate according to any one of 1) to 7) above is bonded with a target formed from a low thermal expansion material.
9) The sputtering target-backing plate assembly according to 8) above, wherein the target formed from a low thermal expansion material is a single material among silicon, germanium, and carbon of 99.99 wt % (4N) or higher, or a composite material containing silicon, germanium, and/or carbon in an amount of 95 wt % or more.

The present invention relates to a backing plate formed mainly from Mo or a Mo alloy having a small coefficient of expansion to be bonded to a target made from a low thermal expansion material, and particularly relates to a backing plate in which an anticorrosive metal having a thickness corresponding to 1/40 to 1/8 of a total thickness of the backing plate is formed as a dense and strong layer on a surface of the Mo or Mo alloy backing plate, from which side the backing plate is cooled (cooling surface side), for preventing the corrosion of Mo being prone to corrosion with cooling water.

With the present invention, since a target formed from a low thermal expansion material and a Mo or Mo alloy backing plate having a similar thermal expansion coefficient are bonded, it is possible to reduce the warpage of sputtering targets as much as possible. It is thereby possible to form a uniform film across the entire substrate with minimal generation of particles.

Moreover, by providing a layer formed from an anticorrosive metal on the cooling surface side of molybdenum, the present invention is able to resolve the conventional problems such as contamination of the cooling water by black powdery rust generated due to the corrosion of molybdenum, and diffusion of rust in the clean room when removing the target.

Moreover, the present invention is also effective in addressing issues during sputtering, with regard to the strength, anticorrosive properties, and cooling capacity of the backing plate itself as well as the bonding strength of the backing plate and the target, as a result of performing anticorrosion treatment while ensuring the appropriate thickness of the molybdenum material having low thermal expansion, high thermal conductivity, and high strength.

The sputtering target that is consequently bonded via brazing yields superior effects of being able to achieve high power sputtering, reduce the percent defective due to uniform deposition, and improve the production efficiency. Moreover, the present invention is able to provide a sputtering target of high cleanliness which will not contaminate the cooling water of sputtering equipment and the surrounding environment such as the clean room.

BRIEF DESCRIPTION OF DRAWINGS

FIGS. 1 *a*) and *b*) are a diagram showing a Mo or Mo alloy backing plate and an anticorrosive metal provided on a surface of the Mo or Mo alloy backing plate, from which side the backing plate is subjected to cooling (cooling surface side), and a diagram in which a sputtering target material is subsequently bonded to the backing plate.

FIG. 2 This is a sectional diagram explaining a case of using a Mo backing plate and diffusion-bonding OFC (Cu) on a surface of the Mo backing plate, from which side the backing plate is subjected to cooling (cooling surface side).

FIG. 3 This is a sectional diagram explaining a case of using a Mo backing plate and diffusion-bonding Al on a surface of the Mo backing plate, from which side the backing plate is subjected to cooling (cooling surface side).

DETAILED DESCRIPTION

As a sputtering method, there are a well-known coating method of using the target side as the cathode and the substrate side as the anode in a sputtering equipment with Ar gas introduced therein, applying voltage to both the cathode and the anode to sputter the target material due to bombardment of the target by Ar ions and coating the substrate with the sputtered target material; and a well-known coating method based on so-called self-sputtering in which the atoms sputtered from the target are ionized to sustain further sputtering.

In many cases, the sputtering target is bonded to a backing plate, and the backing plate is cooled to prevent the abnormal temperature increase of the target so as to enable stable sputtering.

In this kind of sputtering equipment, the sputtering power tends to be increased in order to improve the production efficiency and enable high-speed sputtering. Normally, the backing plate is formed from a material having favorable thermal conductivity and having a certain level of strength. Still, there is a problem in that a temperature difference occurs at the bonded interface between the target and the backing plate, strain becomes accumulated at the bonded part due to the difference in the thermal expansion of both materials, and separation or deformation (warpage) of the target occurs.

Deformation (warpage) of a target causes deterioration in the uniformity of the thin film formed via sputtering, or generation of abnormal particles due to arcing, or in extreme cases stops the generation of plasma.

In order to resolve the foregoing problems, measures such as increasing the strength of the backing plate or changing the material to reduce the thermal stress may be considered, but there is a problem of compatibility with low thermal expansion materials as the target material, and a proper solution had not been discovered to date.

Warpage occurs even when bonding the target and the backing plate material at a temperature that is equal to or higher than the melting point of the brazing material, and thereafter cooling it.

Conventionally, for Si in which the linear expansion coefficient (CTE) at 20° C. is $2.6 \times 10^{-6}$/K, a copper alloy or oxygen-free copper (CTE at 20° C.: approximately $17 \times 10^{-6}$/K) has been used as the backing plate. Thus, the backing plate side would shrink considerably, and the sputtering material side would deform in the shape of a protrusion.

As the countermeasure to the foregoing problem, there are cases of thickening the layer of the brazing material, such as a metal indium solder, which is used for the bonding of the target member and the backing plate to reduce the shrinkage, but there are limitations with a large-diameter target, and it cannot be said that the suppression of warpage was sufficient.

Consequently, a molybdenum backing plate having low thermal expansion (CTE at 20 to 100° C.: 3.7 to $5.3 \times 10^{-6}$/K) and high thermal conductivity was used, and a certain effect has been yielded. Nevertheless, in high power sputtering of semiconductor applications, it was necessary to mount a cooling jacket on the rear face of the molybdenum BP (side opposite to the sputtering surface) and circulate water in order to suppress the rise in temperature of the target.

But here, a serious problem arose. Specifically, because molybdenum that came into direct contact with the cooling water is prone to corrosion to generate black rust, a problem arose in that adverse effects were inflicted on the cooling water (circulating water) and peripheral devices. Thus, it became necessary to improve the anticorrosive properties of Mo. But in this case, such several problems also arose that: molybdenum is a hardly platable material and cannot be plated easily; the plated film is exposed to the atmosphere at a high temperature that is equal to or higher than the melting point of the brazing material because of bonding performed after the plating process, and thereby becomes oxidized and discolored; and it is necessary to eliminate the pinholes existing in the plated film.

Moreover, with the plating method, there are problems in that the practicable plating thickness is thin at roughly 100 μm, and, if there are residual pinholes, water may reach the molybdenum through such pinholes, and it is difficult to take sufficient measures in terms of lifetime improvement.

Moreover, when bonding the copper plate via spot welding, there are places (cavities) where the adhesion of molybdenum and the copper plate is insufficient, and there is a problem in that the cooling capacity in a direction from the cooling surface side toward the target surface will deteriorate.

In light of the above, with the Mo or Mo alloy backing plate of the present invention to be bonded to a target formed from a low thermal expansion material, the Mo or Mo alloy backing plate comprises, on a surface of the Mo or Mo alloy backing plate to be cooled (cooling surface side: opposite side of the target to be bonded), a layer having a thickness corresponding to ¼₀ to ⅛ of a total thickness of the backing plate and formed from one or more types of metals selected from among Cu, Al and Ti, or an alloy thereof.

Accordingly, since the layer formed from an anticorrosive metal is thin, this will result in a backing plate in which the obstruction of the low thermal expansion and shrinkage behavior of molybdenum, which is used as the base of the backing plate, is small, and an effect is yielded in that the warpage during the bonding with the target can be reduced.

For example, a rust-proof layer of an anticorrosive metal can be prepared by diffusion-bonding plate materials. By performing diffusion bonding, the rust-proof layer will be denser and have higher adhesiveness, and therefore, effects are yielded in that pinholes are not generated, and the anticorrosive properties and durability of the cooling surface can be significantly improved. Furthermore, since molybdenum and the anticorrosive layer are completely bonded to each other via diffusion bonding, they will yield favorable heat transference, and high cooling efficiency toward the target side. The present invention is not dependent on the foregoing bonding method, and various bonding methods may be suitably selected.

A level difference may be formed on the surface of the Mo or Mo alloy backing plate to be cooled. When the level difference of the Mo or Mo alloy backing plate to be bonded is 2 mm or more, the backing plate can be cooled efficiently; thus this is effective. A novel technique of the present invention is to bond a separate layer having a thinness corresponding to ¼₀ to ⅛ of the total thickness at the bonded interface of the level difference.

Moreover, when the rear face of the backing plate has a level difference as described above and a burr exists at the edge of the level difference, there are cases where the plate of the anticorrosive metal cannot be superposed tightly on and bonded properly to the face of the backing plate having the level difference. Thus, the edge of the level difference in the surface of the Mo or Mo alloy backing plate should be given a roundness of R1 to R3 (i.e., a radius of curvature of 1 mm to a radius of curvature of 3 mm, as commonly written in a format disclosed, for instance, in JIS B 0701).

The Mo or Mo alloy backing plate of the present invention can also be applied to a square shape, but is normally a disk shape, and is particularly effective in a large backing plate having a diameter of 500 mm or more. This is because, when the diameter increases as in the foregoing case, the difference in displacement caused by the difference in the thermal expansion of the target and the backing plate will increase, and cause the target to become warped more easily.

Moreover, grooves having a depth of 0.08 to 0.4 mm are preferably formed in the surface of the Mo or Mo alloy backing plate to be diffusion-bonded to the surface of the anticorrosive metal to form a diffusion-bonded interface between the Mo or Mo alloy backing plate and the anticorrosive metal. The grooves are expected to receive the material of the anticorrosive metal during the course of the diffusion bonding, and consequently, the interface between the Mo or Mo alloy backing plate and the anticorrosive metal may have a higher bonding strength due to an anchor effect.

With regard to the Mo or Mo alloy, the Mo alloy is preferably an alloy containing Mo in an amount of 80 wt % or more, or, the Mo is preferably pure Mo of 99.999 wt % (5N). While there is no particular limitation in the alloy elements, an alloy containing 0.7 to 1.2 wt % of Cr may be used. This Mo or Mo alloy is a material having high strength and good thermal conductivity.

As a representative configuration of a Mo or Mo alloy backing plate, there is a Mo or Mo alloy backing plate bonded to a target formed from a low thermal expansion material that is a single material among silicon, germanium and carbon of 99.99 wt % (4N) or higher, or a composite material containing silicon, germanium and/or carbon in an amount of 95 wt % or more.

The thus prepared Mo or Mo alloy backing plate of the present invention comprising a layer formed from a metal having anticorrosive properties is capable of suppressing the corrosion of molybdenum that comes into direct contact with cooling water, and eliminating the problem of inflicting adverse effects on drainage water and peripheral devices. Moreover, the present invention is able to increase the strength and cooling capacity of the backing plate itself as well as increase the bonding strength of the backing plate and the target, thereby effectively suppress warpage (deformation) caused by the thermal effect during the bonding of the sputtering target and the backing plate or during sputtering, and consequently resolve the problem of the generation of particles during sputtering.

By bonding the Mo or Mo alloy backing plate prepared as described above and a target formed from a low thermal expansion material, it is possible to obtain the sputtering target-backing plate assembly of the present invention. A target formed from a low thermal expansion material, which is silicon, germanium (CTE at 20° C.: $5.7 \times 10^{-6}$/K), or carbon (CTE of graphite at 20° C.: $3.1 \times 10^{-6}$/K) of 99.99 wt % (4N) or higher, or contains one or more of them as its primary component, may be used to configure the sputtering target-backing plate assembly.

Nevertheless, it goes without saying that the target material to be bonded is not limited to the foregoing materials. Moreover, conventionally known techniques may be adopted for bonding the target and the backing plate, and there is no particular limitation in the bonding method. Note that the description of "4N" above indicates that the amount of metallic impurities excluding gas components such as oxygen, nitrogen, and carbon is 0.01 wt % or less.

EXAMPLES

The present invention is now explained based on Examples and Comparative Examples. Note that the following Examples are merely exemplifications, and the present invention is not limited to such Examples. In other words, the present invention also covers the other modes and modifications included therein.

Example 1

A specific example of the present invention is now explained with reference to FIG. 1 and FIG. 2. Mo having a purity of 3N was processed into a disk shape having a diameter of 540 mm and a total thickness of 20 mm, and a recess having a diameter of 480 mm and a depth of 4 mm was formed by counterboring in one face of the disk-shaped Mo to prepare a material 1 having a concave side as a blank of the backing plate (refer to FIG. 1a), FIG. 1b)). Here, the edge of the level difference part was rounded to R1.5, and grooves having a depth of 0.08 mm were regularly formed on the overall Mo bottom face to yield an anchor effect during bonding (refer to FIG. 2).

Next, oxygen-free copper (OFC) 2 as the anticorrosive metal was processed such that the edge of the protruding part is R1.5, the diameter is 480 mm, the outer diameter is 540 mm, and the total thickness is 7 mm (refer to FIG. 1a), FIG. 1b)). Furthermore, OFC was processed such that the recessed side is over tolerance and the protruding side is minus tolerance.

The recess and protrusion of these two materials were combined and the resulting product was placed in an SUS metal capsule, and the SUS capsule was sealed so that the inside can maintain a vacuum.

Next, by subjecting the capsule to HIP treatment at 650° C.-150 MPa, Mo and OFC were diffusion-bonded. When a different sample prepared under the same conditions was destroyed to observe the cross section of the bonded interface, the result was confirmed, as shown in FIG. 2, that OFC was completely filled in the grooves of Mo, and Mo and OFC have been completely bonded.

The material that underwent HIP treatment was decapsulated, and then machined into a prescribed backing plate shape. Here, since the total thickness of the backing plate after machining will be 18 mm, OFC as the anticorrosive layer having a thickness of 1.20 mm, which corresponds to 1/15 of the total thickness of the backing plate, was used to cover the bottom face of molybdenum. An example of the structure of the processed backing plate is shown in FIG. 1a).

Next, the backing plate and a target material 3, which is silicon as the low thermal expansion material, were bonded at 180° C. by using indium as a brazing material 4, and the resulting product was cooled to room temperature while controlling the rate of temperature decrease. In cases where a conventional backing plate used OFC for its entire surface, the warpage upon applying a straight gauge to the target surface was roughly 0.5 mm due to the difference in the thermal expansion coefficient between OFC and silicon.

Nevertheless, in this Example, the amount of warpage was less than 0.1 mm as a result of using molybdenum having a low thermal expansion as a base, and controlling the ratio of OFC as the anticorrosive layer. An example of the cross-section structure of the bonded sputtering target is shown in FIG. 1b).

Moreover, while the surface of OFC became oxidized and discolored when heated to 180° C. during bonding, it was possible to obtain a clean surface by lightly scrubbing the surface with sandpaper. Next, water was circulated such that cooling water comes into direct contact with the surface of OFC and this operation was performed for 30 days continuously, and then the surface condition was observed. Consequently, the surface of OFC became slightly reddish, but the base Mo was completely protected, and the Mo did not become corroded and generate black rust as in conventional technologies.

A sputtering target obtained by bonding this kind of backing plate and a target material having a low thermal expansion is able to significantly reduce warpage in comparison to conventional technologies, and corrosion did not occur even when the backing plate was water-cooled for a long period, and it was possible to yield low-particle characteristics.

Example 2

A specific example of the present invention is now explained with reference to FIG. 1 and FIG. 3. Mo having a purity of 3N was processed into a disk shape having a diameter of 540 mm and a total thickness of 18 mm, and a recess having a diameter of 480 mm and a depth of 3 mm was formed of by counterboring in one face of the disk-shaped Mo to prepare a material 1 having a concave side as a blank of the backing plate (refer to FIG. 1). Here, the edge of the level difference part was rounded to R1.5, and grooves having a depth of 0.12 mm were regularly formed on the overall Mo bottom face to yield an anchor effect during bonding.

Next, aluminum (5052 alloy) as the anticorrosive metal was processed into a bowl shape such that the edge of the protruding part is R1.5, the diameter is 480 mm, the outer diameter is 600 mm, and the total thickness is 21 mm (refer to FIG. 1 and FIG. 3).

The tolerance of the engaging parts were set to be the same as Example 1. The recess and protrusion of these two materials were combined, and it was covered with an aluminum lid and subjected to EB melting in a vacuum for sealing so that the inside of the aluminum vessel can maintain a vacuum.

Next, by subjecting the capsule to HIP treatment at 400° C.-150 MPa, Mo and aluminum were diffusion-bonded. When a different sample prepared under the same conditions was destroyed to observe the cross section of the bonded interface, the result was confirmed, as shown in FIG. 3, that aluminum was completely filled in the grooves of Mo, and Mo and aluminum have been completely bonded.

The material that underwent HIP treatment was decapsulated, and then machined into a prescribed backing plate shape. Here, since the total thickness of the backing plate after machining will be 17 mm, aluminum as the anticorrosive layer having a thickness of 0.57 mm, which corresponds to 1/30 of the total thickness of the backing plate, was used to cover the bottom face of molybdenum. An example of the structure of the processed backing plate is shown in FIG. 3.

Next, the backing plate and silicon as the low thermal expansion material were bonded at 180° C. by using indium as a brazing material, and the resulting product was cooled to room temperature while controlling the rate of temperature decrease. In cases where a conventional backing plate used aluminum for its entire surface, the warpage upon applying a straight gauge to the target surface was roughly 0.7 mm due to the difference in the thermal expansion coefficient between aluminum and silicon.

Nevertheless, in this Example, the amount of warpage was less than 0.1 mm as a result of using molybdenum having a low thermal expansion as a base, and controlling the ratio of aluminum as the anticorrosive layer. An example of the cross-section structure of the bonded sputtering target is shown in FIG. 1 and FIG. 3.

Next, water was circulated such that cooling water comes into direct contact with the surface of aluminum and this operation was performed for 30 days continuously, and then the surface condition was observed. Consequently, the surface of aluminum hardly showed any change, the base Mo was completely protected, and the Mo did not become corroded and generate black rust as in conventional technologies.

A sputtering target obtained by bonding this kind of backing plate and a target material having a low thermal expansion is able to significantly reduce warpage in comparison to conventional technologies, and corrosion did not occur even when the backing plate was water-cooled for a long period, and it was possible to yield low-particle characteristics.

The present invention is a Mo or Mo alloy backing plate to be bonded to a target formed from a low thermal expansion material, wherein the Mo or Mo alloy backing plate comprises, on a surface of the Mo or Mo alloy backing plate to be cooled (cooling surface side), a layer having a thickness corresponding to 1/40 to 1/8 of a total thickness of the backing plate and formed from an anticorrosive metal obtained by bonding one or more types of metals selected from among Cu, Al and Ti, or an alloy thereof.

Issues that become particularly problematic during sputtering are the warpage of the sputtering target, bonding strength, and the anticorrosive properties of the backing plate. In the present invention, the thermal expansion difference between the target material and the backing plate is reduced, the warpage (deformation) caused by the thermal effect during bonding or during sputtering is reduced thereby, and the internal strain of the bonded interface is suppressed. Moreover, there is a problem in that the water-cooled molybdenum becomes corroded and contaminates the surrounding environment of sputtering equipment, but the present invention yields a superior effect of being able to overcome the foregoing problem.

Consequently, the present invention is able to provide a sputtering target that is superior in sputtering stability, generates less particles, and is able to form a uniform thin film across the entire substrate. Moreover, the present invention is able to maintain the cleanliness of the surrounding environment of sputtering equipment and achieve a uniform deposition even in high power sputtering, and yields superior effects of being able to reduce the percent defective and improve the production efficiency. Thus, the present invention is extremely useful in terms of industrial application.

The invention claimed is:

1. A Mo or Mo alloy backing plate to be bonded to a target, wherein the Mo or Mo alloy backing plate has, on a surface of the Mo or Mo alloy backing plate to be cooled, a layer of an anticorrosive metal bonded thereto having a thickness equal to 1/40 to 1/8 of a total thickness of the backing plate, wherein the surface of the Mo or Mo alloy backing plate bonded to the anticorrosive metal is recessed to a predetermined depth at a location including a center of the surface of the Mo or Mo alloy backing plate and thereby includes a recessed portion and an outer peripheral non-recessed portion, the recessed portion has a face at a level that is spaced from a level of a face of the non-recessed portion, and wherein the surface of the Mo or Mo alloy backing plate bonded to the anticorrosive metal defines a surface edge rounded along a border between the recessed portion and the outer peripheral non-recessed portion.

2. The Mo or Mo alloy backing plate according to claim 1, wherein the anticorrosive metal is one or more metals selected from the group consisting of Cu, Al and Ti, or an alloy thereof.

3. The Mo or Mo alloy backing plate according to claim 2, wherein the predetermined depth and spacing of the level of the face of the recessed portion from the level of the face of the outer peripheral non-recessed portion is 2 mm or more.

4. The Mo or Mo alloy backing plate according to claim 3, wherein the Mo or Mo alloy backing plate is of a disk shape, and a diameter thereof is 500 mm or more.

5. The Mo or Mo alloy backing plate according to claim 4, wherein the surface of the Mo or Mo alloy backing plate bonded to the anticorrosive metal has grooves therein having a depth of 0.08 mm to 0.4 mm, and the grooves are completely filled with material of the anticorrosive metal layer.

6. The Mo or Mo alloy backing plate according to claim 5, wherein the Mo or Mo alloy backing plate is a Mo alloy backing plate made of an alloy containing Mo in an amount of 80 wt % or more.

7. A sputtering target-backing plate assembly, wherein the Mo or Mo alloy backing plate according to claim 5 is bonded with a target made of a low thermal expansion material.

8. The sputtering target-backing plate assembly according to claim 7, wherein the low thermal expansion material is a single material selected from the group consisting of silicon, germanium, and carbon of 99.99 wt % (4N) or higher, or a composite material containing silicon, germanium, and/or carbon in a total amount of 95 wt % or more.

9. The Mo or Mo alloy backing plate according to claim 1, wherein the predetermined depth and spacing of the level of the face of the recessed portion from the level of the face of the outer peripheral non-recessed portion is 2 mm or more.

10. The Mo or Mo alloy backing plate according to claim 1, wherein the Mo or Mo alloy backing plate is of a disk shape and a diameter thereof is 500 mm or more.

11. The Mo or Mo alloy backing plate according to claim 1, wherein the surface of the Mo or Mo alloy backing plate bonded to the anticorrosive metal has grooves therein having a depth of 0.08 mm to 0.4 mm, and the grooves are completely filled with material of the anticorrosive metal layer.

12. The Mo or Mo alloy backing plate according to claim 1, wherein the Mo or Mo alloy backing plate is a Mo alloy backing plate made of an alloy containing Mo in an amount of 80 wt % or more.

13. A sputtering target-backing plate assembly, wherein the Mo or Mo alloy backing plate according to claim 1 is bonded with a target made of a low thermal expansion material.

14. The sputtering target-backing plate assembly according to claim 13, wherein the low thermal expansion material is a single material selected from the group consisting of silicon, germanium, and carbon of 99.99 wt % (4N) or higher, or a composite material containing silicon, germanium, or carbon in a total amount of 95 wt % or more.

* * * * *